United States Patent
Lee et al.

(10) Patent No.: US 9,546,417 B2
(45) Date of Patent: Jan. 17, 2017

(54) VACUUM EVAPORATING APPARATUS

(71) Applicant: Samsung Display Co., Ltd., Gyeonggi-do (KR)

(72) Inventors: Young-Uk Lee, Yongin (KR); Jeong-Won Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 186 days.

(21) Appl. No.: 14/020,218

(22) Filed: Sep. 6, 2013

(65) Prior Publication Data

US 2014/0264120 A1 Sep. 18, 2014

(30) Foreign Application Priority Data

Mar. 14, 2013 (KR) .................. 10-2013-0027487

(51) Int. Cl.
| | |
|---|---|
| C23C 14/24 | (2006.01) |
| F16K 51/02 | (2006.01) |
| F16K 1/20 | (2006.01) |
| F16K 1/16 | (2006.01) |
| F16K 31/53 | (2006.01) |

(52) U.S. Cl.
CPC .............. *C23C 14/24* (2013.01); *F16K 1/16* (2013.01); *F16K 1/2007* (2013.01); *F16K 31/53* (2013.01); *F16K 51/02* (2013.01)

(58) Field of Classification Search
CPC .. F16K 31/521; F16K 31/52441; F16K 51/02; F16K 31/53; F16K 31/54; F16K 31/535; F16K 1/20; F16K 1/16; F16K 1/2007; F16K 1/18; C23C 14/24

USPC ............... 251/326, 228–229, 213, 215, 301, 298,251/300, 299, 302–303, 248, 250.5, 250, 118,251/193, 195; 137/637.4, 601.15, 625.28; 74/422, 89.17, 89.18; 454/333–336

See application file for complete search history.

(56) References Cited

U.S. PATENT DOCUMENTS

| | | | | | |
|---|---|---|---|---|---|
| 2,443,036 | A | * | 6/1948 | Hopkins | 251/228 |
| 3,847,210 | A | * | 11/1974 | Wells | 251/250 |
| 4,065,097 | A | * | 12/1977 | Timin | 251/228 |
| 4,582,296 | A | * | 4/1986 | Bachmann | 251/326 |
| 4,911,029 | A | * | 3/1990 | Banba et al. | 74/2 |
| 2002/0108572 | A1 | * | 8/2002 | Yamazaki | C23C 14/12 |
| | | | | | 118/715 |
| 2004/0011988 | A1 | * | 1/2004 | Chini et al. | 251/301 |
| 2005/0218365 | A1 | * | 10/2005 | Wallace | F16K 51/02 |
| | | | | | 251/279 |
| 2010/0300920 | A1 | * | 12/2010 | Wagner et al. | 251/193 |

FOREIGN PATENT DOCUMENTS

| | | |
|---|---|---|
| JP | 2006-002200 | 1/2006 |
| JP | 2008-234923 | 10/2008 |
| KR | 10-2000-0054212 A | 9/2000 |
| KR | 10-2005-0077997 A | 8/2005 |

* cited by examiner

*Primary Examiner* — Michael R Reid
(74) *Attorney, Agent, or Firm* — Lee & Morse, P.C.

(57) ABSTRACT

A vacuum evaporating apparatus includes a driving unit, a linear-moving portion connected to the driving unit to move linearly, a rotational-moving portion connected to the linear-moving portion to move rotationally, and a shutter portion connected to the rotational-moving portion to pivot.

12 Claims, 1 Drawing Sheet

VACUUM EVAPORATING APPARATUS

CROSS-REFERENCE TO RELATED PATENT APPLICATION

Korean Patent Application No. 10-2013-0027487, filed on Mar. 14, 2013, in the Korean Intellectual Property Office, and entitled "VACUUM EVAPORATING APPARATUS" is incorporated herein in its entirety by reference.

BACKGROUND

1. Field

Embodiments relate to a vacuum evaporating apparatus.

2. Description of the Related Art

Electronic apparatuses based on mobility have been widely used. As mobile electronic apparatuses, tablet-sized personal computers (PCs) as well as small-size electronic apparatuses such as mobile phones have come into wide use.

To support various functions, the mobile electronic apparatuses include displays for providing visual information such as still or moving images to users. With the recent trend toward miniaturization of parts for driving the displays, more attention is given to the displays in the electronic apparatuses.

SUMMARY

Embodiments relate to a vacuum evaporating apparatus including a driving unit, a linear-moving portion connected to the driving unit to move linearly, a rotational-moving portion connected to the linear-moving portion to move rotationally, and a shutter portion connected to the rotational-moving portion to pivot.

The driving unit may be an actuator having a variable length.

The vacuum evaporating apparatus may further include a fixing portion in which the shutter portion is installed to pivot and to which the linear-moving portion is connected to slide.

The vacuum evaporating apparatus may further include a first guide between the fixing portion and the linear-moving portion to guide sliding of the linear-moving portion.

The linear-moving portion may include a moving portion connected with the driving unit to move linearly, a transferring portion connected with the moving portion, and a moving block connected with the transferring portion.

The rotating portion may include a spur gear. The moving block includes a rack gear that operates in connection with the rotating portion.

The rotating portion may include a first rotating portion connected with the linear-moving portion to rotate during movement of the linear-moving portion, and a second rotating portion connected with the first rotating portion and the shutter portion, the second rotating portion transferring rotation of the first rotating portion to the shutter portion.

A surface of the shutter portion may be in a mesh form.

The shutter portion may include a first shutter body portion, and a second shutter body portion that is bent from the first shutter body portion.

The shutter portion may include a reinforcing rib connected with the first shutter body portion and the second shutter body portion.

The vacuum evaporating apparatus may further include a first shock absorbing portion in the linear-moving portion.

The first shock absorbing portion may include a first fixing bracket fixed in the linear-moving portion, and a first shock absorbing member in the first fixing bracket.

The vacuum evaporating apparatus may further include a second shock absorbing portion spaced apart from the linear-moving portion.

The second shock absorbing portion may include a second fixing bracket fixed on an outer portion of the second shock absorbing portion, and a second shock absorbing member in the second fixing bracket.

The vacuum evaporating apparatus may further include a second guide in the linear-moving portion to guide movement of the linear-moving portion.

BRIEF DESCRIPTION OF THE DRAWINGS

Features will become more apparent by describing in detail an exemplary embodiment thereof with reference to the attached drawings in which.

DETAILED DESCRIPTION

Embodiments will become apparent from the description below in detail with reference to the accompanying drawings. However, the disclosed embodiments and may be implemented in different forms. The embodiments are provided to complete the disclosure and to allow those of ordinary skill in the art to fully understand the scope thereof as defined by the claims. The terms used herein are for illustrative purposes of the inventive concept only and should not be construed to limit the meaning or the scope thereof. As used in this specification, a singular form may, unless definitely indicating a particular case in terms of the context, include a plural form. Also, the expressions "comprise" and/or "comprising" used in this specification neither define the mentioned components, steps, operations and/or elements, nor exclude the presence or addition of one or more other different components, steps, operations and/or elements, or addition of these. As used herein, terms such as "first," "second," etc. are used to describe various components, but components should not be defined by these terms. Terms are used only for distinguishing one component from another component.

Figure 1:
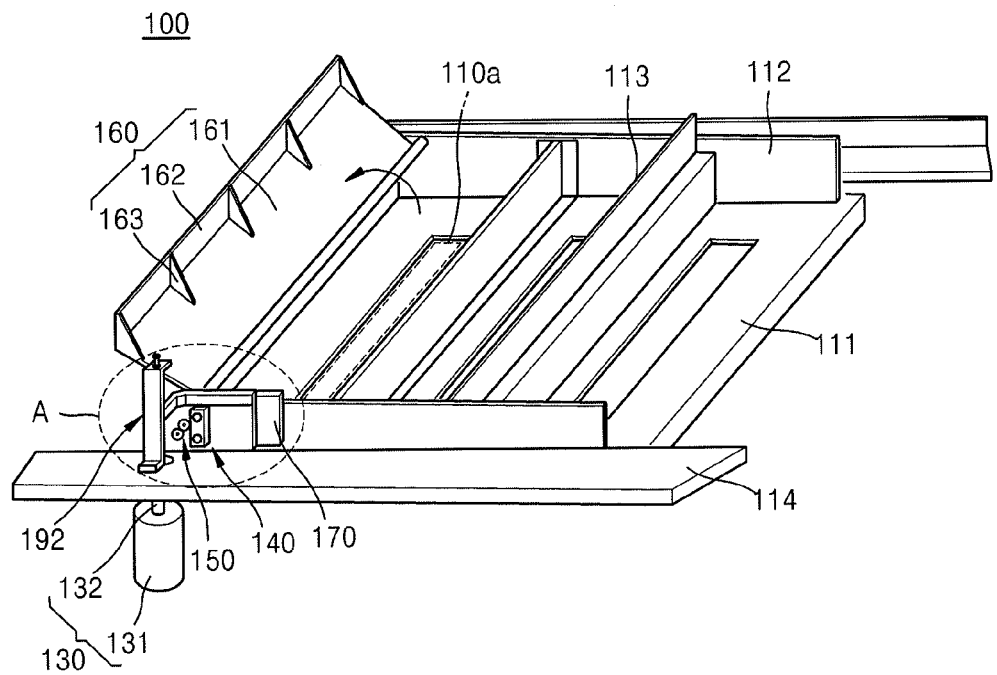
FIG. 1 is a perspective view illustrating a vacuum evaporating apparatus according to an embodiment.
Figure 2:
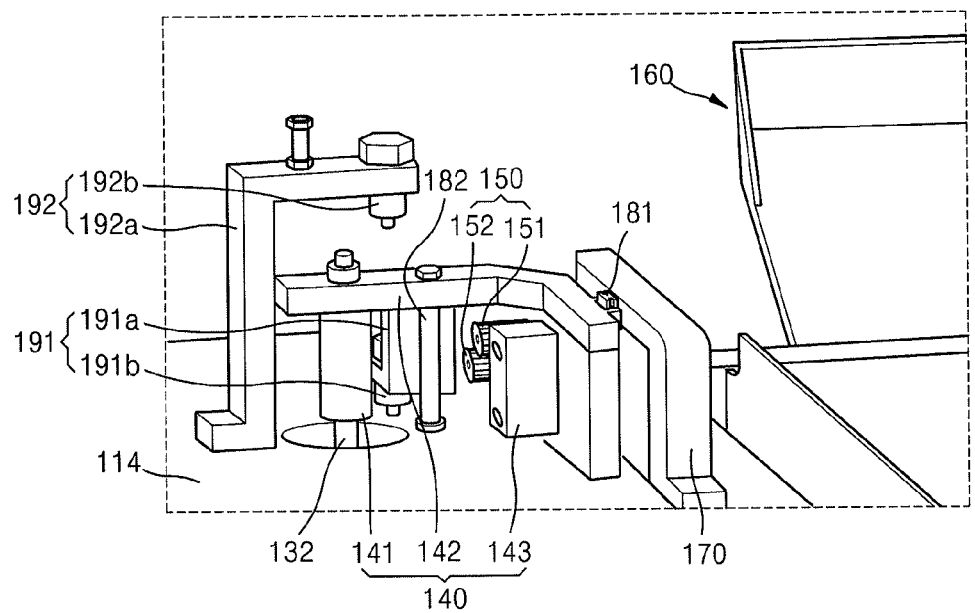
FIG. 2 is an enlarged partial perspective view illustrating a portion A of FIG. 1.

FIG. 1 is a perspective view illustrating a vacuum evaporating apparatus 100 according to an embodiment, and FIG. 2 is an enlarged partial perspective view illustrating a portion A of FIG. 1.

Referring to FIGS. 1 and 2, the vacuum evaporating apparatus 100 includes a chamber (not shown) whose inner space is held in a vacuum state. The vacuum evaporating apparatus 100 may also include source units 110 for heating and spraying an evaporating material and a reflector 111 in which the source unit is installed.

The vacuum evaporating apparatus 100 may include a side monomer-attaching plate 112 connected with the reflector 111. The vacuum evaporating apparatus 100 may also include an angle limiting plate 113 which is installed between the source units to limit a spray angle of the evaporating material sprayed from the source units. The vacuum evaporating apparatus 100 may further include a fixing frame 114 which is fixedly installed in the chamber.

The vacuum evaporating apparatus 100 may include an air box (not shown) installed in the chamber. The vacuum evaporating apparatus 100 may also include a driving unit 130 installed in the air box. The air box may be held in an atmospheric pressure state, and the driving unit 130 may include an actuator (for example a cylinder 131) having a variable length. In particular, the driving unit 130 may include a cylinder 131 which operates with pneumatic pressure or hydraulic pressure and a shaft 132 which is installed in the cylinder 131 to move linearly. In other implementations, the driving unit 130 may include any structure which has a variable length and is capable of moving other apparatuses or objects linearly. However, for convenience's sake, the following description will be made based on a case where the driving unit 130 includes the cylinder which operates with hydraulic pressure and the shaft 132.

The vacuum evaporating apparatus 100 may include a linear-moving portion 140 which moves in connection with the driving unit 130. The vacuum evaporating apparatus 100 may include a rotational-moving portion 150 which rotates in connection with the linear-moving portion 140. The rotational-moving portion 150 may transform the linear movement of the linear-moving portion 140 into rotational movement.

The linear-moving portion 140 may include a moving portion 141 which linearly moves in connection with the driving unit 130. The linear-moving portion 140 may also include a transferring portion 142 connected with the moving portion 141 and a moving block 143 connected with the transferring portion 142.

The moving portion 141 may move up and down linearly according to the operation of the driving unit 130. The transferring portion 142 may transfer movement of the moving portion 141 to the moving block 143. The moving block 143 may move linearly together with the moving portion 141 according to the movement of the moving portion 141 transferred from the transferring portion 142.

The rotational-moving portion 150 may include a first rotating portion 151 which is connected with the linear-moving portion 140 to rotate with the movement of the linear-moving portion 140. The rotational-moving portion 150 may further include a second rotating portion 152 which is connected with the first rotating portion 151 and a shutter portion 160 to transfer the rotation of the first rotating portion 151 to the shutter portion 160.

The first rotating portion 151 and the second rotating portion 152 may have outer surfaces in a gear form. The first rotating portion 151 and the second rotating portion 152 may have spur gears. The moving block 143 may have a rack gear to be shape-matched with the spur gears.

The vacuum evaporating apparatus 100 may include the shutter portion 160 which is connected with the rotational-moving portion 150 to pivot. The surface of the shutter portion 160 may be formed in a mesh form. The mesh-form surface of the shutter portion 160 may facilitate evaporation of an evaporating material described below thereon, thus preventing the evaporating material on the surface of the shutter portion 160 from falling to the source units.

The shutter portion 160 may include a first shutter body portion 161 and a second shutter body portion 162. The shutter portion 160 may also include a reinforcing rib 163 which connects the first shutter body portion 161 with the second shutter body portion 162.

The first shutter body portion 161 and the second shutter body portion 162 may form a predetermined angle therebetween. In particular, the second shutter body portion 162 may be perpendicular to the first shutter body portion 161 to minimize interference with an external device in rotation of the shutter portion 160.

The reinforcing rib 163 may be plural, and the plurality of reinforcing ribs 163 may be spaced apart from each other. The reinforcing rib 163 may be formed in a portion where the first shutter body portion 161 and the second shutter body portion 162 meet each other, thereby maintaining angle and shape formed between the first shutter body portion 161 and the second shutter body portion 162 in spite of an external environment.

The vacuum evaporating apparatus 100 may include a fixing portion 170 in which the shutter portion 160 is installed in such a way to pivot and to which the linear-moving portion 140 is connected in such a way to slide. A first guide 181 may be installed between the fixing portion 170 and the linear-moving portion 140 for guiding movement of the linear-moving portion 140. The first guide 181 may be in the form of a linear motion (LM) guide. The first guide 181 may be plural, and the plurality of first guides 181 may connect the fixing portion 170 with the moving block 143 to prevent the moving block 143 from deviating from a moving path.

The vacuum evaporating apparatus 100 may include a first shock absorbing portion 191 installed in the linear-moving portion 140 and a second shock absorbing portion 192 installed spaced apart from the linear-moving portion 140. The first shock absorbing portion 191 and the second shock absorbing portion 192 may reduce shock applied to the linear-moving portion 140 according to rotation of the shutter portion 160. In particular, the first shock absorbing portion 191 and the second shock absorbing portion 192 may reduce movement of the transferring portion 142 corresponding to the operation of the shutter portion 160.

The first shock absorbing portion 191 may include a first fixing bracket 191a installed in the linear-moving portion 140. The first fixing bracket 191a may be installed to be fixed on the transferring portion 142. The first shock absorbing portion 191 may include a first shock absorbing member 191b installed in the first fixing bracket 191a. The first shock absorbing member 191b may be formed in various forms. For example, the first shock absorbing member 191b may include a ball flinger, and may also include rubber, spring, and so forth.

The second shock absorbing portion 192 may include a second fixing bracket 192a installed to be fixed on an outer portion thereof. In particular, the second fixing bracket 192a may be installed to be fixed in the fixing frame 114. The second shock absorbing portion 192 may include a second shock absorbing member 192b installed in the second fixing bracket 192a. The second shock absorbing member 192b is formed in the same manner as or a similar manner to the first shock absorbing member 191b, and thus, a detailed description thereof will not be repeated.

The first shock absorbing member 191b may prevent the linear-moving portion 140 from moving in an excessive range in rotation of the shutter portion 160. For example, when the shutter portion 160 is opened, the first shock absorbing member 191b may contact the fixing frame 114 to prevent the linear-moving portion 140 from deviating from a movement range due to a load of the shutter portion 160. When the shutter portion 160 is closed, the second shock absorbing member 192b may contact the transferring portion 142 to prevent the linear-moving portion 140 from deviating from the movement range due to a load of the shutter portion 160.

The vacuum evaporating apparatus 100 may include a second guide 182 which is installed in the linear-moving portion 140 to guide movement of the linear-moving portion 140. The second guide 182 may be installed between the fixing frame 114 and the transferring portion 142, and the transferring portion 142 may linearly move along the second guide 182.

As to the operation of the vacuum evaporating apparatus 100, first, the inner space of the chamber is formed at the atmospheric pressure, a substrate is loaded. Then, the inner space of the chamber may be held in a vacuum state.

When the inner space of the chamber is held in the vacuum state, the source units are driven to evaporate and provide an evaporating material to the substrate (not shown). The source units may be plural, and a main material and an auxiliary material of the evaporating material may be stored in the plurality of source units. The plurality of source units may be heated at the same time. Once heating of the source units is completed, the shutter portion 160 opens the source units to supply the evaporating material to the substrate.

In the foregoing case, the driving unit 130 may operate according to a preset control signal. The driving unit 130 may operate to linearly move the linear-moving portion 140. In particular, the driving unit 130 may operate to move the linear-moving portion 140 up and down. For convenience's sake, the following description will be based on a case where the shutter portion 160 is opened when the linear-moving portion 140 moves downwardly.

For example, when the length of the driving unit 130 decreases, the driving unit 130 may move the moving portion 141 down. As the moving portion 141 moves down, the moving portion 141 moves the transferring portion 142 down and the transferring portion 142 moves the moving block 143 down. In particular, the moving block 143 may slide along the fixing portion 170 using the first guide 181 as described above.

When the moving block 143 moves down in this way, the moving block 143 may rotate the first rotating portion 151 in a clockwise direction. The first rotating portion 151 may rotate the second rotating portion 152 in a counterclockwise direction.

When the second rotating portion 152 rotates in the counterclockwise direction, the shutter portion 160 connected to the second rotating portion 152 may pivot to open the source units. The shutter portion 160 may open the source units at a predetermined speed.

When the shutter portion 160 rotates in this way, the rotating speed of the shutter portion 160 may increase due to the deadweight of the shutter portion 160 if the shutter portion 160 rotates a predetermined angle or more. In this case, the rotating speed of the second rotating portion 152 may also increase due to the rotating speed of the shutter portion 160. The increase in the rotating speed of the second rotating portion 152 may result in the increase in the rotating speed of the first rotating portion 151, applying a force to the moving block 143.

When the force is applied to the moving block 143, the falling speed of the transferring portion 142 and the moving portion 141 connected to the moving block 143 may increase. When the first shock absorbing member 191b contacts the fixing frame 114, the first shock absorbing member 191b may absorb a part of a falling force of the linear-moving portion 140. Moreover, the first shock absorbing member 191b may prevent the rotating speed of the shutter portion 160 from increasing by reducing the falling speed of the linear-moving portion 140.

By providing the evaporating material to the substrate from the source units, the evaporating material may be evaporated onto the substrate. The shutter portion 160 may be held open when the evaporating material is completely evaporated onto the substrate.

Upon completion of the foregoing process, the state of the evaporating material evaporated on the substrate may be checked. In particular, after the state of the evaporating material on the substrate is checked, the evaporating material may be provided to the substrate again when desired. In this case, the thickness of the main material or the auxiliary material of the evaporating material may be measured to close or open the source units which supply the main material or the auxiliary material, thereby correcting the evaporation level of the evaporating material of the substrate.

When the evaporation level of the evaporation material on the substrate is corrected, at least one of the plurality of source units may be closed by the shutter portion 160. In this case, the driving unit 130 may be operated to operate the linear-moving portion 140, and the shutter portion 160 may be closed by the linear-moving portion 140.

When the length of the driving unit 130 increases, the driving unit 130 may raise the moving portion 141. As the moving portion 141 moves up, the transferring portion 142 may move up. The transferring portion 142 may transfer movement of the moving portion 141 to the moving block 143, thus moving the moving block 143 up. The moving block 143 may slide the fixing portion 170 by the first guide 181 as described above.

As such, when the moving block 143 moves up, the moving block 143 may rotate the first rotating portion 151 in a counterclockwise direction. According to rotation of the first rotating portion 151, the second rotating portion 152 may rotate in the clockwise direction.

As the second rotating portion 152 rotates, the shutter portion 160 connected to the second rotating portion 152 may pivot in a specific direction. The shutter portion 160 may rotate to close the source units.

If the shutter portion 160 operates in this way, the falling speed of the shutter portion 160 may increase when the shutter portion 160 passes a specific point while rotating. When the falling speed of the shutter portion 160 increases, the shutter portion 160 may increase the rotating speed of the second rotating portion 152. The second rotating portion 152 may increase the rotating speed of the first rotating portion 151, and the first rotating portion 151 may increase the rising speed of the moving block 143.

If the rising speed of the moving block 143 increases, the linear-moving portion 140 may deviate from the moving path or apply shock to connected other components. In this state, if the transferring portion 142 rises to a particular level, the second shock absorbing member 192b contacts the transferring portion 142, thus reducing the rising speed of the transferring portion 142 and reducing shock applied to other components. Moreover, the second guide 182 guides the falling or rising path of the transferring portion 142 in falling or rising of the transferring portion 142, thereby preventing the transferring portion 142 from being warped or deviating from the falling or rising path.

In the vacuum evaporating apparatus 100, if the shutter portion 160 pivots, the evaporating material evaporated on the shutter portion 160 to the source units may deviate. In particular, if the shutter portion 160 closes the source units or rotates excessively rapidly, the evaporating material may deviate from the surface of the shutter portion 160. When the evaporating material deviates from the surface of the shutter portion 160 and is introduced to the source units, the operation of the source units may be disturbed. However, the mesh structure formed on the surface of the shutter portion 160 according to an embodiment improves an adsorbing force between the evaporating material and the surface of the shutter portion 160, thereby preventing or reducing the likelihood of the occurrence of such disturbance.

Therefore, the vacuum evaporating apparatus 100 simultaneously heats the source unit of the main material of the evaporating material and the source unit of the auxiliary material of the evaporating material through the shutter portion 160, thus improving working efficiency. Moreover, in the vacuum evaporating apparatus 100, when the shutter portion 160 is completely opened, the evaporating angle of the evaporating material sprayed from the source units is not disturbed, thus securing the evaporation angle in a stable and large range.

By way of summation and review, a display may include an organic light emitting diode such that an organic light emitting layer emits light with current applied from outside, thus implementing various images and characters. The organic light emitting diode may be formed in various ways. For example, the light emitting diode may be formed using organic evaporation, laser heat transfer, and print screen, among which organic evaporation is frequently used because of forming an organic light emitting diode in a simple sequence and at a low cost.

Embodiments provide a vacuum evaporating apparatus capable of controlling a thickness of an individual film.

While embodiments have been described with reference to the aforementioned embodiment, various modifications or changes can be made without departing from the subject matter or scope. Therefore, the scope of the appended claims may include such modifications or changes included in the subject matter.

What is claimed is:

1. A vacuum evaporating apparatus, comprising:
   a driving unit;
   a linear-moving portion;
   a rotational-moving portion connected to the linear-moving portion to move rotationally, the linear-moving portion connected to the driving unit to move linearly with respect to the rotational-moving portion; and
   a shutter portion, the shutter portion including a first shutter body portion, a second shutter body portion that is bent from one end of the first shutter body portion, and an axis portion at an opposite end of the first shutter body portion from the second shutter body portion, the axis portion being axially connected to the rotational-moving portion to pivot the shutter portion, the shutter portion being positioned in the vacuum evaporating apparatus with respect to a source of an evaporating material to be selectively openable to allow an evaporating material to be evaporated onto a substrate or closable to block the evaporating material,
   wherein the linear-moving portion includes:
      a moving portion connected with the driving unit to move linearly;
      a transferring portion connected with the moving portion; and
      a moving block connected with the transferring portion.

2. The vacuum evaporating apparatus of claim 1, wherein the driving unit is an actuator having a variable length.

3. The vacuum evaporating apparatus of claim 1, further comprising:
   a fixing portion to which the linear-moving portion is connected to slide.

4. The vacuum evaporating apparatus of claim 3, further comprising:
   a first guide between the fixing portion and the linear-moving portion to guide sliding of the linear-moving portion.

5. The vacuum evaporating apparatus of claim 1, wherein:
   the rotational-moving portion includes a spur gear.

6. The vacuum evaporating apparatus of claim 1, wherein the shutter portion includes:
   a reinforcing rib connected with the first shutter body portion and the second shutter body portion.

7. The vacuum evaporating apparatus of claim 4, further comprising a second guide on the linear-moving portion to guide movement of the linear-moving portion.

8. A vacuum evaporating apparatus, comprising:
   a driving unit;
   a linear-moving portion connected to the driving unit to move linearly;
   a rotational-moving portion connected to the linear-moving portion to move rotationally;
   a shutter portion, the shutter portion including a first shutter body portion, a second shutter body portion that is bent from one end of the first shutter body portion, and an axis portion at an opposite end of the first shutter body portion from the second shutter body portion, the axis portion being axially connected to the rotational-moving portion to pivot the shutter portion, the shutter portion being positioned in the vacuum evaporating apparatus with respect to a source of an evaporating material to be selectively openable to allow an evaporating material to be evaporated onto a substrate or closable to block the evaporating material, wherein the rotational-moving portion includes:
   a first rotating portion connected with the linear-moving portion to rotate during movement of the linear-moving portion; and
   a second rotating portion having a geared outer surface engaged with a geared outer surface of the first rotating portion and the shutter portion, the second rotating portion transferring rotation of the first rotating portion to the shutter portion.

9. A vacuum evaporating apparatus, comprising:
   a driving unit;
   a linear-moving portion connected to the driving unit to move linearly;
   a rotational-moving portion connected to the linear-moving portion to move rotationally;
   a shutter portion, the shutter portion including a first shutter body portion, a second shutter body portion that is bent from one end of the first shutter body portion, and an axis portion at an opposite end of the first shutter body portion from the second shutter body portion, the axis portion being axially connected to the rotational-moving portion to pivot the shutter portion, the shutter portion being positioned in the vacuum evaporating apparatus with respect to a source of an evaporating material to be selectively openable to allow an evaporating material to be evaporated onto a substrate or closable to block the evaporating material; and a first shock absorbing portion on the linear-moving portion.

10. The vacuum evaporating apparatus of claim 9, wherein the first shock absorbing portion includes:
    a first fixing bracket fixed on the linear-moving portion; and
    a first shock absorbing member on the first fixing bracket.

11. The vacuum evaporating apparatus of claim 10, further comprising:

a second shock absorbing portion spaced apart from the linear-moving portion.

12. The vacuum evaporating apparatus of claim 11, wherein the second shock absorbing portion includes:
a second fixing bracket fixed on an outer portion of the second shock absorbing portion; and
a second shock absorbing member in the second fixing bracket.

* * * * *